United States Patent [19]

Weedall

[11] Patent Number: 4,500,813
[45] Date of Patent: Feb. 19, 1985

[54] LIGHTING SYSTEM

[76] Inventor: Dennis L. Weedall, 695 W. Calumet Rd., River Hills, Wis. 53217

[21] Appl. No.: 402,785

[22] Filed: Jul. 28, 1982

[51] Int. Cl.³ .............................................. H05B 41/16
[52] U.S. Cl. .................................. 315/276; 315/199; 315/206
[58] Field of Search .................. 315/276, 206, 33, 64, 315/82, 185, 199, 291, 7; 313/579

[56] References Cited

U.S. PATENT DOCUMENTS

| | | | |
|---|---|---|---|
| 3,028,523 | 4/1962 | Seid | 315/64 |
| 3,361,900 | 1/1968 | Berg et al. | 362/257 |
| 3,780,328 | 12/1973 | Boddy et al. | 313/579 |
| 3,980,921 | 9/1976 | Izawa | 315/276 |
| 4,163,925 | 8/1979 | Gyursanszky | 315/199 |
| 4,338,540 | 7/1982 | Sovilla | 313/579 |
| 4,367,432 | 1/1983 | Glenny et al. | 313/579 |

OTHER PUBLICATIONS

J.C. Penney Catalog, Fall and Winter 1981, pp. 837, 844, 845, 1155, Sears Catalog, 1977, p. 1134.

Primary Examiner—Harold Dixon
Attorney, Agent, or Firm—Andrus, Sceales, Starke & Sawall

[57] ABSTRACT

A lighting system (11) utilizes a high intensity quartz halogen bulb (12) surrounded by a spaced dome (18) to permit substantially spherical radiation of luminous energy for general area illumination. A control mechanism (41) responds to a remotely located manually operable switch (37) and includes a transformer (47) coupled to a power source (61) through a gatable triac (52) having a gate terminal (56) connected to the power source (61) through a series circuit (57) including a resistor (58), a diac (59) and a capacitor (60). The closure of the remotely located manual switch (37) activates the control mechanism (41) to gate the triac (52) into conduction to thereby energize the transformer (47) and the inter-connected high intensity quartz halogen bulb (12). An alternative embodiment provides three high intensity quartz halogen bulbs (71-73) connected in series circuit with a diode (77) to provide extremely high intensity light.

6 Claims, 3 Drawing Figures

LIGHTING SYSTEM

BACKGROUND OF THE INVENTION

This invention relates to a lighting system and is particularly useful for the illumination of a high intensity quartz halogen bulb to provide substantially spherical radiation of predetermined luminous energy for general area illumination which is substantially equivalent to the luminous energy supplied by standard incandescent light bulbs but at a substantially lower wattage.

High intensity quartz halogen bulbs have been used for special application including slide projectors and vehicle driving and fog lights.

Low voltage, standard tungsten filament intensity electric lamps have been suggested for use with adapters which position a transformer between a lamp and a socket, such as illustrated in the U.S. Pat. No. 3,361,900 dated Jan. 2, 1968. Applications of this concept appear to include certain reading lamps and decorative outdoor lighting employing reflective conical shades for light concentration.

SUMMARY OF THE INVENTION

A lighting system for use with a electrical power source having a first predetermined power rating provides a remote light assembly to be energized by a second predetermined power rating different than the first power rating and includes a light bulb connected to an input circuit through a manually operable switch. An electronic control interconnects the power source to the remote light assembly and includes a transformer having a first winding electrically connected to the manual switch and a second winding inductively coupled to the first winding and electrically connected to the power source through a gatable triac having a gate circuit operably connected to a capacitance and the transformer. The gate circuit responds to a change in the power factor provided by the closing of the remotely located manual switch to gate the triac into conduction to conduct electrical energy from the power source to the transformer for energizing the bulb.

A diac in the gate circuit substantially eliminates current flow through the transformer when the manual switch is in an open condition to permit the transformer to cool when the remote light assembly is in an off condition for eliminating or substantially reducing power losses.

The lighting system features as replaceable light to be used in lieu of standard incandescent light bulbs and provides a high intensity quartz halogen bulb. A dome surrounds the bulb to permit substantially spherical radiation of luminous energy from the bulb for general area lumination. The dome further prevents dirt and debris from engaging the bulb and creating localized heat which might otherwise damage the bulb. In the preferred embodiment, the bulb is spaced by a substantial distance from the dome to permit convection of heat from the bulb to the dome for the irradiation of heat through a substantial surface area of the dome to permit rapid cooling. The control supplies a predetermined voltage and current to the bulb to provide a predetermined magnitude of luminous energy substantially equivalent to the luminous energy supplied by standard incandescent light bulbs but at substantially lower wattage.

In an alternative form of the invention, a plurality of high intensity quartz halogen bulbs are connected in series circuit without the use of a transformer and are located within the dome to provide increased luminous energy. A rectifying diode may be connected within such series circuit to provide uni-directional current flow.

The invention provides standard lighting for residential and commercial use to replace standard incandescent type bulbs while providing substantially the same luminous energy but at a substantially reduced energy.

Further advantages and aspects of the invention will be set forth in the drawings and detailed description set forth hereafter.

BEST MODE FOR CARRYING OUT THE INVENTION

Figure 1:
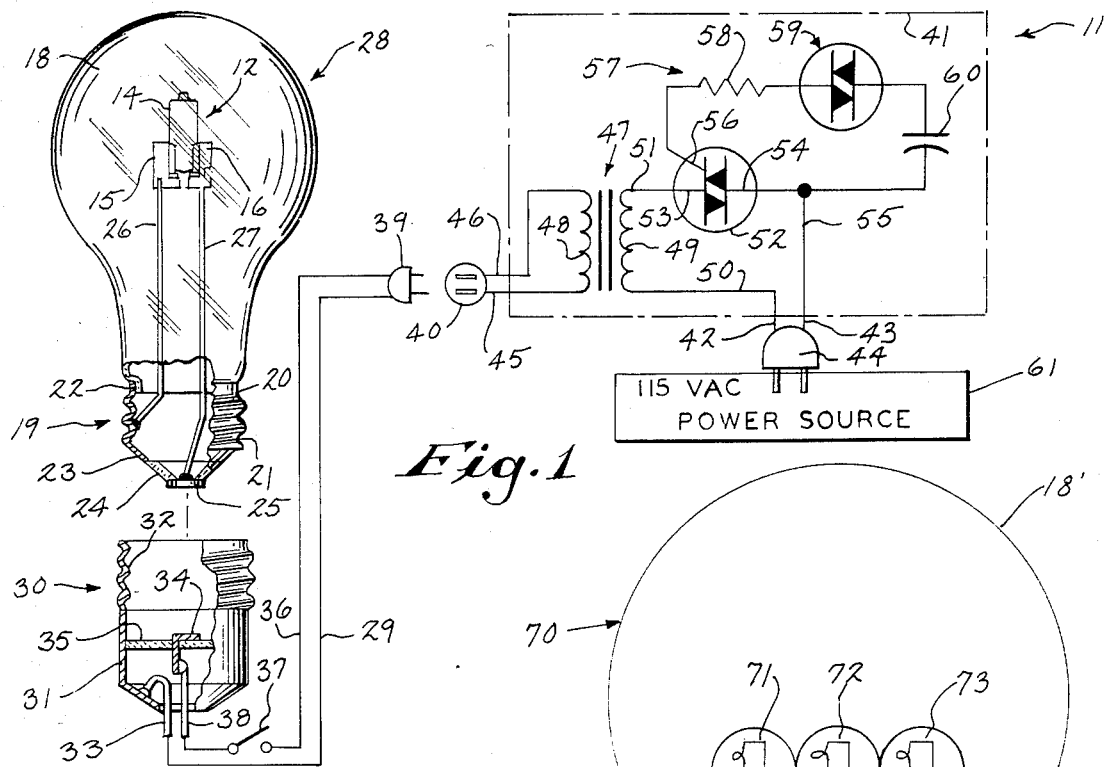
FIG. 1 is a diagrammatic view and circuit illustration of a lighting system featuring a high intensity quartz halogen type bulb.

A lighting system 11 features a high intensity quartz halogen type bulb 12, which may be selected from any one of a number of commercially available quartz halogen type bulbs and may include a twelve (12) volt, fifty-five (55) watt bulb such as commercially sold by Philips under Catalog No. 12,311. In any event, the quartz halogen bulb 12 includes a filament 13 within a sealed envelope 14 or glass or the like. Opposite ends of the filament 13 are connected to external electrical terminals 15 and 16 by appropriate leads 17 passing through sealed openings within the envelope 14.

A dome 18 of glass or other suitable material surrounds the bulb 12 and is spaced therefrom so as to surround the bulb 12 by air or other suitable gas. The dome 18 may be either clear or frosted and functions to diffuse the light and to prevent dirt and debris from forming on envelope 14 to cause hot spots which might otherwise damage bulb 12.

A male type connector 19 is connected to dome 18 to form an enclosure about bulb 12. The male type connector 19 includes an annular electrical conducting ring 20 having external screw threads 21. A first axial end 22 of connector 19 is affixed to the dome 18 while a second oppositely spaced axial end 23 is connected to an annular insulating member 24. An electrical terminal 25 is axially located to be connected to the insulating member 24.

A pair of electrical conductors interconnect the male connector 19 with the bulb 12 to support such bulb and conduct electrical energy thereto for providing illumination. Specifically, a first conductor 26 electrically connects the conducting ring 20 with terminal 15 while an electrical conductor 27 electrically connects the axially located terminal 25 with terminal 16.

The quartz halogen bulb 12 and interconnected male connector 19 and surrounding envelope 18 provides a highly desirable self-contained replaceable light source 28 which is capable of being removably inserted in conventional internal and external lighting fixtures such as commonly found in residential and commercial use. The light source 28 provides high intensity luminous energy of a predetermined magnitude substantially equivalent to the luminous energy generated by a standard tungsten filament type light bulb rated at about 100 watts or the like. The use of a quartz halogen bulb 12 rated at approximately twelve (12) volts and fifty-five (55) watts and operated to consume approximately fifty (50.0) watts will provide the equivalent luminous energy of a standard one hundred (100) watt tungsten filament type bulb thereby resulting in a substantial savings in energy. Comparable energy savings to other wattage standard tungsten filament type bulbs can be achieved by varying the values of the components of this device.

The light source 28 may removably be secured to a standard type electrical receptable 30 such as commonly found in lamps and lighting fixtures. For example, the electrical receptacle 30 may include an annular electrically conducting ring 31 providing internal screw threads 32 which releasably engage the external screw threads 21 to retain and support the light source 28. The conducting ring 31 is connected to an electrical input lead 29 through an appropriate conductor 33. A centrally located electrical contact 34 is mounted to the ring 31 through an electrical insulator 35 and is positioned to removably engage the electrical terminal 25 of the light source 28. The contact 34 is electrically connected to an input lead 36 through a manually operable switch 37 and a conductor 38. The leads 29 and 36 are connected to a conventional male type wall plug 39 suitable for removable connection to a female type electrical connector 40.

The electrical receptacle 30 together with the manual switch 37 and connector 39 may be provided by a conventional lamp or the like or could be provided by a special construction for permanent or movable placement.

A control mechanism 41 includes a pair of input leads 42 and 43 connected to a male type terminal connector 44 which is adaptable to be connected to a source 61 of a predetermined power rating, such as a conventional one hundred and ten (110) or two hundred and twenty (220) volt A.C. electrical power service. The control mechanism 41 includes a pair of output leads 45 and 46 which are removably connected to leads 29 and 36, respectively, through the connectors 39 and 40.

An iron core type transformer 47 provides a secondary winding 48 connected to circuit leads 45 and 46. A primary winding 49 is inductively coupled to the secondary winding 48 and is connected through a circuit 50 to the input lead 42. The winding 49 is further connected through a circuit 51 to a gatable triac 52. Specifically, a power terminal 53 of triac 52 is connected to the primary 49 through lead 51 while a power terminal 54 of triac 52 is connected to the input lead 43 through a connecting circuit 55. A gate terminal 56 of triac 52 is connected to the input lead 43 through a series connected circuit 57 including a resistor 58, a diac 59, a capacitor 60 and the connecting circuit 55.

In operation with the manual switch 37 in an open position, a circuit path can be traced through input lead 43, connecting circuit 55, capacitor 60, diac 59, resistor 58, gate terminal 56, power terminal 53 of triac 52, primary winding 49, connecting circuit 50 and input lead 42. The inductance of the primary winding 49 provides a magnetizing current $I_m$.

The closing of switch 37 produces an impedance change at the secondary winding 48 which causes the primary current $I_m$ to advance in phase to a near unity power factor to enable the triac 52 to be gated into conduction. With triac 52 conducting in response to the closure of switch 37, a substantially reduced voltage, such as approximately twelve (12) volts for example, is provided at output leads 45 and 46 and supplied through leads 29 and 36, receptacle 30, male connector 19, electrical connectors 26 and 27 to energize the quartz halogen bulb 12 to produce high intensity illumination thereof. The transformer 47 operates to energize the quartz halogen bulb 12 with substantially reduced power consumption over what is generally required for standard incandescent bulbs.

The switch mechanism 41 may be formed as an integral part of the electrical receptacle 30 or may be remotely located from switch 37 and receptacle 30, such as illustrated in FIG. 1. The spacing of the switch mechanism 41 from the light source 28 has the desirable effect of keeping any heat generated by the transformer 47 away from the quartz halogen bulb 12, which also generates considerable heat. In such manner, the switch mechanism 41 can be manually actuated from a remote location. The inter-connection of the triac in circuit with the transformer primary 49 together with the capacitor 60 and diac 59 in series with the gate circuit 56 results in a substantially minimal current flow to the transformer 47 with switch 37 in an open position. Such construction substantially reduces or eliminates transformer drain when switch 37 is in an open condition and the light source 28 is in an off condition. In such manner, the transformer 47 is permitted to cool during an "off" condition which permits increased intermittent loading to the transformer 47. The switch mechanism 41 thus provides a unique operation in transferring from a no load condition to a loaded condition in response to a command from a remotely located location. In addition, since this method permits the heavy transformer to be placed remote from the host bulb receptical, the device will not alter the weight and/or balance requirements of the host bulb receptical. Similarly, size restrictions are minimized.

Figure 2:
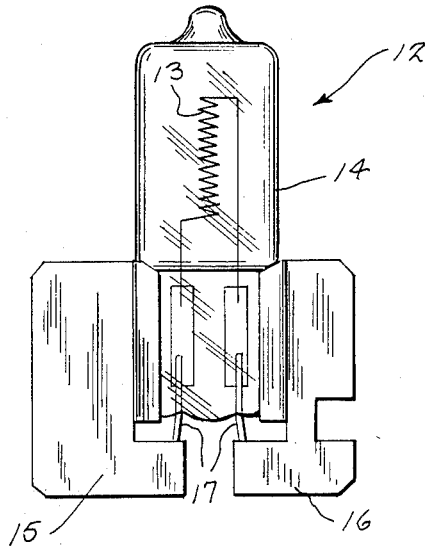
FIG. 2 is a side view illustration of a bulb employed in FIG. 1.
Figure 3:
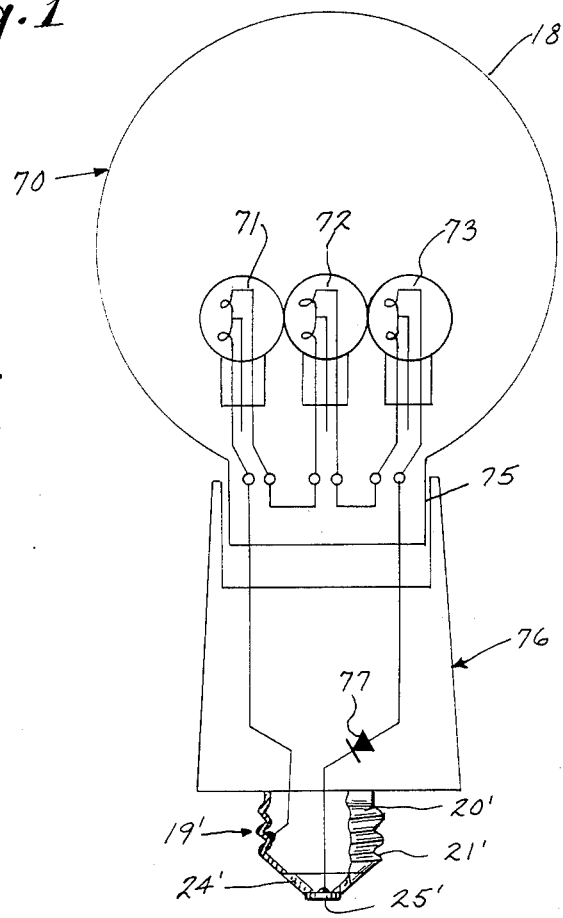
FIG. 3 is a diagrammatic illustration of an alternative embodiment of the lighting system employing a plurality of high intensity quartz halogen type bulbs.

An alternative lighting system 70 is illustrated in FIG. 4 and components which are similar or identical to those discussed with respect to FIG. 1 will be identified with identical numbers primed. The system 70 may be used in conjunction with the receptacle 30, however the switch mechanism 41 may be omitted. Such lighting system 70 includes the use of three serially connected high intensity quartz type halogen bulbs 71, 72 and 73 each being of the type as illustrated in FIG. 2. An outer dome 18' surrounds the bulbs 71 through 73 which is joined at 75 to a supporting structure 76 including a male type connector 30'. An electrical diode 77 is connected in the series circuit with bulbs 71 through 73 to permit only uni-directional current flow through the series circuit.

In operation, the half wave rectified current supplied from a conventional one hundred and ten (110) volt or two hundred and twenty (220) volt source is supplied to the series connected circuit including the plurality of high intensity quartz halogen bulbs 71 through 73. Because of the series connection, the voltage across each individual bulb 71 through 73 is within the voltage rating thereof, i.e. twelve (12) volts for example. The alternative lighting system 70 can be used to provide an extremely high intensity light through the use of a multiplicity of high intensity quartz halogen type bulbs which may be removably inserted into standard lamps or other suitable electrical connectors commonly found in residential and commercial establishments without requiring the use of step down transformers.

A highly desirable light system is provided which produces substantially spherical radiation of predetermined luminous energy for general area illumination which is substantially equivalent to the luminous energy supplied by standard incandescent and fluorescent light bulbs but at a substantially lower wattage.

Various modes of carrying out the invention are contemplated as being within the scope of the following claims particularly pointing out and distinctly claiming the subject matter which is regarded as the invention.

I claim:

1. A lighting system for use with an electrical power source having a first predetermined power rating, comprising a remote light assembly to be energized by a second predetermined power rating different than said first power rating and including a light bulb connected to an input circuit through a manually operable switch, and an electronic control mechanism interconnecting said power source to said remote light assembly, said control mechanism including a transformer having a first winding electrically connected to said manual switch for completing the lamp circuit and a second winding inductively coupled to said first winding and electrically connected to said power source through a gatable triac having a gate circuit operatively connected through capacitive means to said power source, closing of said remotely located manual switch changing the impedance of said transformer which changes the current phase and enables said gate circuit to gate said triac into conduction to conduct electrical energy from said power source to said transformer for energizing said bulb.

2. The lighting system of claim 1, and including a diac electrically connected to said gate circuit to substantially eliminate current flow through said transformer with said manual switch in an opened condition, and wherein closing of said manual switch decreases the impedance of said transformer and advances the phase of said current to a near unity power factor.

3. The lighting system of claim 1, wherein said bulb comprises a high intensity lamp operable at a first predetermined voltage and said power source provides a second predetermined voltage substantially greater than said first voltage.

4. The lighting system of claim 3, wherein said lamp comprises a high intensity quartz halogen bulb.

5. A lighting system for use with an electrical power source having a first predetermined power rating, comprising a light bulb to be energized by a second predetermined power rating different than said first power rating, and circuit means selectively electrically connecting said bulb to said power source for selectively energizing said bulb, said circuit means including a first switch manually operable between first and second positions and a transformer operatively electrically connected for selectively receiving electrical energy of said first power rating from said power source and selectively operatively providing electrical energy of said second power rating to said bulb and a second switch electrically operated between a first condition to supply electrical energy to said bulb and a second condition to substantially terminate the supply of electrical energy to said bulb, said first switch in said second position decreasing the impedance of said transformer to advance current phase to a near unity power factor, said second switch having an input operatively connected to said transformer and to capacitive means to supply a first control signal in response to the transfer of said first switch to said first position for transferring said second switch to said second condition to substantially terminate the supply of energy and a second control signal in response to the transfer of said first switch to said second position for transferring said second switch to said first condition to supply electrical energy to said bulb.

6. A lighting system for connection to standard commercial and residential electrical outlets, comprising a high intensity quartz halogen type bulb rated at approximately twelve volts and fifty-five watts, a dome spaced from said bulb in surrounding relationship thereto and connected to a male connector including an annular electrical conducting ring having external screw threads connected at a first axial end to said dome and connected at an oppositely spaced axial end to an annular insulating member which, in turn, retains an axially located electrical terminal, first and second electrical connectors connected to said annular ring and said terminal, respectively, and connected to said bulb to support said bulb in spaced relationship with respect to said dome and to conduct energizing electricity thereto, an electrical receptacle to removably retain said male connector including an annular electrically conducting ring having internal screw threads releasably engaging said external screw threads releasably engaging said external screw threads to retain and support said male connector and dome and electrically connected to a first electrical lead and an electrical contact removably engaging said electrical terminal of said male connector and electrically connected to a second electrical lead through a manually operable switch, a switch mechanism to connect said first and second electrical leads to third and fourth electrical leads, respectively, provided by a standard male type electrical connector plug to be connected to a standard commercial residential electrical outlet supplying one hundred and ten volts A.C. and the like, said switch mechanism including an iron core transformer having a secondary winding connected to said first and second electrical leads and a primary winding inductively coupled to said secondary winding with a first circuit connected to said third electrical lead and a second circuit connected to said fourth electrical lead through a gatable triac having a gate circuit connected to said fourth electrical lead through a series circuit including a resistor, a diac and a capacitor, closing of said manually operable switch decreasing the impedance of said transformer to advance the current phase to a near unity power factor enabling said gate circuit to gate said triac into conduction to supply electrical energy through said transformer to energize said quartz halogen type bulb to provide a predetermined magnitude of luminous energy substantially equivalent to the luminous energy of a standard one hundred watt incandescent bulb operating on a standard A.C. circuit.

* * * * *